US012805200B2

(12) United States Patent
Xing et al.

(10) Patent No.: US 12,805,200 B2
(45) Date of Patent: Nov. 17, 2026

(54) ACTIVATION FUNCTION GENERATOR BASED ON MAGNETIC DOMAIN WALL DRIVEN MAGNETIC TUNNEL JUNCTION AND MANUFACTURING METHOD

(71) Applicant: INSTITUTE OF MICROELECTRONICS, CHINESE ACADEMY OF SCIENCES, Beijing (CN)

(72) Inventors: Guozhong Xing, Beijing (CN); Long Liu, Beijing (CN); Di Wang, Beijing (CN); Huai Lin, Beijing (CN); Yan Wang, Beijing (CN); Xiaoxin Xu, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 512 days.

(21) Appl. No.: 18/264,903

(22) PCT Filed: Mar. 19, 2021

(86) PCT No.: PCT/CN2021/081812
§ 371 (c)(1),
(2) Date: Aug. 9, 2023

(87) PCT Pub. No.: WO2022/193290
PCT Pub. Date: Sep. 22, 2022

(65) Prior Publication Data
US 2024/0122075 A1 Apr. 11, 2024

(51) Int. Cl.
*H10N 50/20* (2023.01)
*G06N 3/063* (2023.01)
(Continued)

(52) U.S. Cl.
CPC ............. *H10N 50/20* (2023.02); *G06N 3/063* (2013.01); *H10B 61/00* (2023.02); *H10N 50/01* (2023.02); *H10N 50/80* (2023.02); *H10N 50/85* (2023.02)

(58) Field of Classification Search
CPC ........ H10N 50/20; H10N 50/80; H10N 50/01; H10N 50/85; H10B 61/00; G06N 3/063
See application file for complete search history.

(56) References Cited

U.S. PATENT DOCUMENTS

2005/0230771 A1* 10/2005 Ha ........................ H10N 50/10 257/E27.005
2016/0238675 A1* 8/2016 Ide ........................ H10N 50/85
(Continued)

FOREIGN PATENT DOCUMENTS

CN 108336222 A 7/2018
CN 109284816 A 1/2019
(Continued)

OTHER PUBLICATIONS

Chen, Gong, et al., "Large Dzyaloshinskii-Moriya interaction induced by chemisorbed oxygen on a ferromagnet surface," *Sci Adv*., vol. 6, No. 33, 7 pages (Aug. 14, 2020).
(Continued)

*Primary Examiner* — Norman D Richards
*Assistant Examiner* — Sean Ayers Winters
(74) *Attorney, Agent, or Firm* — Christensen, Fonder, Dardi & Busse PLLC; John P. Fonder

(57) ABSTRACT

An activation function generator based on a magnetic domain wall driven magnetic tunnel junction and a method for manufacturing the same are provided, including: a spin orbit coupling layer configured to generate a spin orbit torque; a ferromagnetic free layer formed on the spin orbit coupling layer and configured to provide a magnetic domain
(Continued)

wall motion racetrack; a nonmagnetic barrier layer formed on the ferromagnetic free layer; a ferromagnetic reference layer formed on the nonmagnetic barrier layer; a top electrode formed on the ferromagnetic reference layer; antiferromagnetic pinning layers formed on two ends of the ferromagnetic free layer; a left electrode and a right electrode respectively formed at two positions on the antiferromagnetic pinning layers.

10 Claims, 5 Drawing Sheets

(51) Int. Cl.

| | |
|---|---|
| ***H10B 61/00*** | (2023.01) |
| ***H10N 50/01*** | (2023.01) |
| ***H10N 50/80*** | (2023.01) |
| ***H10N 50/85*** | (2023.01) |

(56) References Cited

U.S. PATENT DOCUMENTS

2019/0312196 A1 10/2019 Choi et al.
2020/0058847 A1* 2/2020 Lee ........................ H10N 50/10
2020/0242462 A1* 7/2020 Friedman ............... G06N 3/088
2020/0365653 A1* 11/2020 Tsai ........................ H10B 61/00
2022/0406508 A1* 12/2022 Chen ................... H01F 10/3236

FOREIGN PATENT DOCUMENTS

CN 109521996 A 3/2019
CN 110212087 A 9/2019
CN 110504355 A 11/2019
JP 2019-176099 A 10/2019
WO WO 2021/034594 A2 2/2021

OTHER PUBLICATIONS

Sengupta, Abhronil, "Proposal for an All-Spin Artificial Neural Network: Emulating Neural and Synaptic Functionalities Through Domain Wall Motion in Ferromagnets," *IEEE Transactions on Biomedical Circuits and Systems*, vol. 10, No. 6, pp. 1152-1160 (Dec. 2016).
Siddiqui, Saima A., et al., "Magnetic Domain Wall Based Synaptic and Activation Function Generator for Neuromorphic Accelerators," *Nano Letters*, vol. 20, No. 2, pp. 1033-1040 (Dec. 31, 2019).
Wang, Chao, et al., "Compact Model of Dzyaloshinskii Domain Wall Motion-Based MTJ for Spin Neural Networks," *IEEE Transactions on Electron Devices*, vol. 67, No. 6, pp. 2621-2626 (Jun. 2020).

* cited by examiner (a)

(b)

ACTIVATION FUNCTION GENERATOR BASED ON MAGNETIC DOMAIN WALL DRIVEN MAGNETIC TUNNEL JUNCTION AND MANUFACTURING METHOD

CROSS-REFERENCE TO RELATED APPLICATION

This application is a Section 371 National Stage Application of International Application No. PCT/CN2021/081812, filed Mar. 19, 2021, entitled "ACTIVATION FUNCTION GENERATOR BASED ON MAGNETIC DOMAIN WALL DRIVEN MAGNETIC TUNNEL JUNCTION AND MANUFACTURING METHOD", which is incorporated herein by reference in its entirety.

TECHNICAL FIELD

The present disclosure relates to the technical field of artificial neural network in the field of artificial intelligence, and in particular to an activation function generator based on a magnetic domain wall driven magnetic tunnel junction and a manufacturing method.

BACKGROUND

With the advent of the era of big data, artificial intelligence, brain-inspired computing and other related fields have attracted extensive attention from researchers. Although human beings still have very limited knowledge of their own brains, researchers have made it clear that the core elements of the human brain are neurons and synapses. Neurons release corresponding output signals when stimulated by inputs, and synapses adjusts the strength of interconnections between the neurons according to the neuron signals. The core of an artificial neural network (ANN) is to imitate a function of an activation function of synapses and neurons of the human brain, which has outstanding advantages in the field of pattern recognition.

In 2014, IBM produced CMOS synapses and CMOS neurons. However, an ordinary silicon transistor can only achieve volatile binary switching, and is not a preference for bionic neurons and synapses. Based on a CMOS circuit, a hardware neural network of Von Neumann architecture even needs hundreds of layers to process a complex problem, and each layer includes a large number of interconnections. As a result, it is difficult to be effectively promoted and applied in terms of power consumption and circuit complexity. In the existing technologies, a linear change of magnetoresistance of a magnetic tunnel junction (MTJ) generated by the magnetic domain motion is mainly used to simulate a synapse function, but there are few reports on configuring it to realize the function of a neuron nonlinear activation function.

SUMMARY

In view of the above technical problems, an activation function generator based on a magnetic domain wall driven magnetic tunnel junction and a manufacturing method are provided according to the present disclosure, so as to at least partially solve the above technical problems.

To this end, according to an aspect of the present disclosure, there is provided an activation function generator based on a magnetic domain wall driven magnetic tunnel junction, including:

- a spin orbit coupling layer configured to generate a spin orbit torque;
- a ferromagnetic free layer formed on the spin orbit coupling layer and configured to provide a magnetic domain wall motion racetrack;
- a nonmagnetic barrier layer formed on the ferromagnetic free layer;
- a ferromagnetic reference layer formed on the nonmagnetic barrier layer;
- a top electrode formed on the ferromagnetic reference layer;
- antiferromagnetic pinning layers formed on both ends of the ferromagnetic free layer; and
- a left electrode and a right electrode respectively formed at two positions on the antiferromagnetic pinning layers.

In an embodiment, a material of the spin orbit coupling layer includes one or more of W, Pt, Pd or Ta, or an alloy based on one or more of W, Pt, Pd or Ta; the ferromagnetic free layer and the ferromagnetic reference layer include one or more of a CoFeB, CoFe, Co/Pt or Ni/Co material with perpendicular magnetic anisotropy; a synthetic antiferromagnetic layer or a ferrimagnetic layer is selected to be formed by the ferromagnetic reference layer so as to eliminate an effect of a stray field of the reference layer on magnetic domain wall motion; and the nonmagnetic barrier layer includes one or more of MgO, $HfO_x$ or $AlO_x$.

In an embodiment, the two ends of the ferromagnetic free layer have magnetic moment directions respectively pinned in a +z direction and a −z direction through antiferromagnetic coupling, so as to serve as nucleation regions for a magnetic domain wall; under control of a pulsed current, a magnetic domain wall nucleates in a pinning region and moves in the free layer; and a magnetoresistance change of a magnetic tunnel junction device is linearly related to a moving distance of the magnetic domain wall in the free layer.

In an embodiment, in a manufacturing process, a DMI intensity at an interface between the free layer and the spin orbit coupling layer in a corresponding region is quantitatively adjusted by performing chemical adsorption of gas at interface of the free layer.

In an embodiment, the activation function generator implements different functionalities of the activation function by changing an interval between the pinning regions.

In an embodiment, an effective mixed spin conductance and a spin transparency of the spin orbit coupling layer are enhanced by performing gas adsorption at a surface or an interface of a heavy metal spin orbit coupling layer.

In an embodiment, a combination of non-uniformly distributed pinning regions is replaced with a combination of uniformly distributed pinning regions, so as to achieve a function of a synaptic device.

According to another aspect of the present disclosure, a method for manufacturing the activation function generator as described above is provided, including:

- forming local pinning regions at two ends of the ferromagnetic free layer through antiferromagnetic coupling, where the two local pinning regions have magnetic moment directions respectively pinned in a +z direction and a −z direction, so as to serve as nucleation regions for a magnetic domain wall; applying a pulsed current to form a magnetic domain wall in the pinning region, wherein the magnetic domain wall moves in the free layer under control of a spin orbit torque generated by the pulsed current;
- designing a domain wall pinning region;

performing gas adsorption at a surface or an interface of a heavy metal spin orbit coupling layer, so as to greatly enhance an effective mixed spin conductance and a spin transparency of the spin orbit coupling layer; and driving a magnetic domain to different positions by accumulating a pulse number, so as to switch between different resistance states of the magnetic tunnel junction.

In an embodiment, a polarity of the pulsed current is changed so as to control nucleation of magnetic domain wall and drive the magnetic domain wall to move.

In an embodiment, a magnetoresistance of the magnetic domain wall driven magnetic tunnel junction is represented by:

$$R_{MTJ} = R_P \frac{x_0}{L} + R_{AP}\left(1 - \frac{x_0}{L}\right)$$

where $x_0$ is a final moving distance of the magnetic domain wall, L is a total length of the magnetic tunnel junction, $R_P$ is a magnetoresistance corresponding to magnetization directions of the ferromagnetic free layer and the reference layer are parallel, which is a minimum magnetoresistance; $R_{AP}$ is a magnetoresistance corresponding to the magnetization directions of the ferromagnetic free layer and the reference layer being antiparallel, which is a maximum magnetoresistance; and a DMI enhancement layer is interposed between the ferromagnetic free layer and the nonmagnetic barrier layer.

Figure 1:
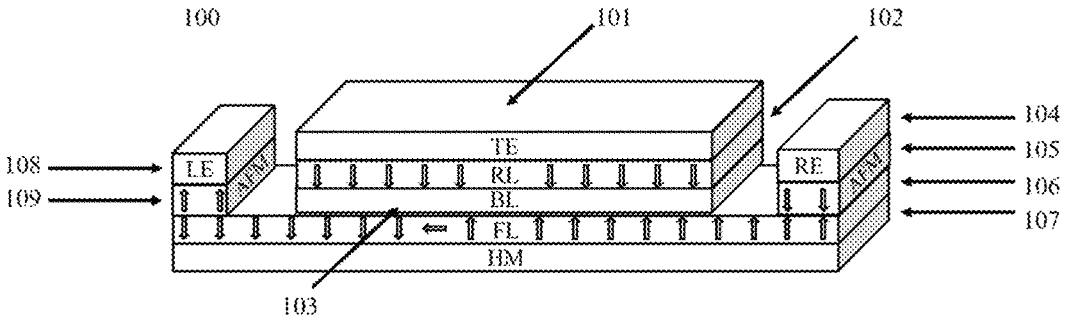
FIG. 1 shows a schematic diagram of a structure of an MTJ-based activation function generator according to an embodiment of the present disclosure.

In the above accompanying drawings, reference numerals have meanings as follows:

100, activation function generator; 101, upper electrode; 102, ferromagnetic reference layer; 103, nonmagnetic barrier layer; 104, left electrode; 105, antiferromagnetic pinning layer; 106, ferromagnetic free layer; 107, spin orbit coupling layer; 108, right electrode; 109, antiferromagnetic pinning layer; 200, free layer pinning region; 201, magnetic domain wall pinning region set artificially; 202, nucleation region for magnetic domain wall.

DETAILED DESCRIPTION OF EMBODIMENTS

Nonvolatile memories and the in-memory computing technology based on the nonvolatile memories provide researchers with a new idea and possibility. In terms of biomimetic neural and synaptic functions. MRAM (Magnetic Random Access Memory) based on magnetic domain wall motion has advantages over other types of nonvolatile memories. MRAM based on magnetic domain wall motion may modulate the domain wall motion by using an all-electrical method, and a change of a magnetic moment of a free layer caused by the magnetic domain wall motion is directly reflected in the tunneling magnetoresistance (TMR) effect of the MTJ (magnetic tunnel junction). Therefore, the modulation of domain wall motion, pinning and depinning by electrical means may effectively achieve multi-resistance state modulation. According to the relationship between the moving distance of the magnetic domain wall and TMR, the linear adjustment of synaptic weight and the functionality of the neuron activation function may be further implemented.

The present disclosure provides a preparation technique of a Sigmoid activation function generator based on magnetic domain wall driven magnetic tunnel junction and an integrated application thereof. Under the control of a full electrical field, a controllable nucleation, motion and pinning of a magnetic domain wall may be achieved using a pulsed current, and a magnetoresistance change of a tunnel junction device is effectively modulated through a spin orbit torque. The device includes a spin orbit coupling layer, a ferromagnetic free layer, a nonmagnetic barrier layer, and a ferromagnetic reference layer. A Dzyaloshinskii-Moriya interaction (DMI) intensity at an interface between the free layer and the spin orbit coupling layer may be effectively controlled by performing local $O_2$ adsorption processing at the free layer interface, so that a pinning region of the magnetic domain wall is formed. By adjusting the DMI intensity and setting intervals between pinning regions, a nonlinear Sigmoid activation function characteristic relationship between the device resistance state and the pulse number may be achieved. In the present disclosure, a structure, a manufacturing technique, an operation method, and an integration application of the activation function generator are described. The device has a simple structure and a material system compatible with the CMOS process, which is conducive to large-scale manufacturing and practical application.

In order to make the objectives, technical solutions and advantages of the present disclosure clearer, the present disclosure will be further described in detail below in combination with specific embodiments and with reference to the accompanying drawings.

FIG. 1 shows a schematic diagram of a structure of an activation function generator according to the present technical solution, and the structure is mainly divided into three parts: an MTJ (magnetic tunnel junction), a spin orbit coupling layer, and an electrode contact. The activation function generator is a three-terminal device, including an upper electrode 101, a left electrode 104, and a right electrode 108. A ferromagnetic reference layer 102, a nonmagnetic barrier layer 103, and a ferromagnetic free layer 106 constitute the MTJ, and a resistance state of the device is read by using a tunneling magnetoresistance effect (TMR). Two ends of the ferromagnetic free layer 106 have magnetic moments respectively pinned in opposite directions (+z/−z) by antiferromagnetic pinning layers 105 and 109 by the antiferromagnetic coupling effect, so as to serve as nucleation regions for a magnetic domain wall. The operation method of the activation function generator is as follows: a writing pulsed current is injected into the spin orbit coupling layer 107 through the left/right electrodes, and the spin orbit coupling layer 107 generates a spin orbit torque (SOT) by the spin orbit coupling (SOC) effect to drive the magnetic domain wall to nucleate and move in the free layer; and a read pulse current flows through the MTJ from the top electrode, and the resistance state information of the device is read using the TMR effect.

The present disclosure discloses a gas-assisted Sigmoid activation function generator based on a magnetic domain wall driven magnetic tunnel junction (MTJ), including: a spin orbit coupling layer configured to generate a spin orbit torque; a ferromagnetic free layer formed on the spin orbit coupling layer and configured to provide a magnetic domain wall motion racetrack; a nonmagnetic barrier layer formed on the ferromagnetic free layer; a ferromagnetic reference layer formed on the nonmagnetic barrier layer and having a magnetic direction being pinned; a top electrode formed on the reference layer; antiferromagnetic pinning layers formed on two ends of the free layer; and a left electrode and a right electrode formed on the antiferromagnetic pinning layers. In the present disclosure, the magnetic domain wall is used as an information carrier, and pinning refers to the fact that the magnetic domain wall is stopped at a preset position and stays at the preset position. That the magnetic domain wall stays at different positions represents different states.

According to a further embodiment of the present disclosure, a material of the spin orbit coupling layer includes one or more of W, Pt, Pd or Ta, or an alloy based on one or more of W, Pt, Pd or Ta. The ferromagnetic free layer and the reference layer include one or more of materials such as CoFeB, CoFe, Co/Pt and Ni/Co with perpendicular magnetic anisotropy. Preferably, a synthetic antiferromagnetic layer (SAF) or a ferrimagnetic layer may be selected to be formed by the reference layer, so as to eliminate an effect of a stray field of the reference layer on the magnetic domain wall motion. The nonmagnetic barrier layer includes one or more of MgO, $HfO_x$ or $AlO_x$.

According to a further embodiment of the present disclosure, the two ends of the free layer have magnetic moment directions respectively pinned in a +z direction and a −z direction through antiferromagnetic coupling, so as to serve as the nucleation regions for a magnetic domain wall. Under the control of a pulsed current, the magnetic domain wall nucleates in the pinning region and moves in the free layer. A magnetoresistance change of an MTJ device is linearly related to a moving distance of the magnetic domain wall in the free layer.

According to a further embodiment of the present disclosure, in a manufacturing process, a DMI intensity at an interface between the free layer and the spin orbit coupling layer in a corresponding region is quantitatively adjusted by performing chemical adsorption of gas (such as $O_2$) at a free layer interface. A region having a high DMI intensity is equivalent to a potential well for the magnetic domain wall, and when the potential well has an appropriate depth, the potential well may be used as an effective pinning region for the magnetic domain wall. Here, DMI is an antisymmetric interaction between spins and may be used to modulate an energy of the magnetic domain wall, where DMI may be used to form an energy potential well, so that the magnetic domain wall is trapped in the potential well and cannot break free, thereby achieving the pinning.

According to a further embodiment of the present disclosure, a reasonable design of an interval between pinning regions according to the functionality of the function to be implemented may achieve a nonlinear Sigmoid function relationship between the pulse number and the MTJ tunneling magnetoresistance, so as to implement the functionality of the neuron activation function.

According to a further embodiment of the present disclosure, the adsorption of gas (such as $O_2$ or $H_2$) at the surface/interface of the spin orbit coupling layer may greatly enhance an effective mixed spin conductance and a spin transparency of the spin orbit coupling layer, so that an efficiency of electronic charge flow to spin flow conversion, i.e., an efficiency of the SOT driven magnetic domain wall motion, may be further improved, thereby further improving the operation speed of the device and reducing energy consumption.

According to a further embodiment of the present disclosure, the function of a synaptic device may be achieved by simply replacing a combination of non-uniformly distributed pinning regions with a combination of uniformly distributed pinning regions. The activation function generator and the synaptic device which are manufactured under the same technical solution and process conditions are conducive to a direct construction of a neural network, so that the difficulty of integration is reduced.

According to the present disclosure, there is further provided a manufacturing method of the activation function generator as described above, which specifically includes the following steps.

First, local pinning regions are respectively formed at the two ends of the ferromagnetic free layer by antiferromagnetic coupling, the two local pinning regions have magnetic moment directions respectively pinned in the +z direction and the −z direction, so as to serve as nucleation regions for a magnetic domain wall. A pulsed current is applied to form a magnetic domain wall in the pinning region, and the magnetic domain wall moves in the free layer under the control of a spin orbit torque generated by the pulsed current. Also, a polarity of the pulsed current may be changed to control the nucleation of the magnetic domain wall and drive the magnetic domain wall to move.

Second, a domain wall pinning region is designed. A magnetoresistance of the magnetic domain wall driven MTJ may be represented by:

$$R_{MTJ} = R_P \frac{x_0}{L} + R_{AP}\left(1 - \frac{x_0}{L}\right).$$

Here, $x_0$ is a final moving distance of the magnetic domain wall, and L is a total length of the MTJ. Therefore, the distance between adjacent pinning regions may be reasonably designed to achieve the nonlinear Sigmoid function relationship between the pulse number and the magnetic domain wall position. A quantitative control of the DMI intensity of the free layer/spin orbit coupling layer may be realized through gas assistance. Sci. Adv. 2020; 6: eaba4924 reported that the adsorption of every one layer of oxygen molecules may enhance the DMI of a Ni/Co multilayer by (0.63±0.26) meV/atom. A gas adsorption window is etched on the free layer by using a photolithography process, and gas is not absorbed where the free layer is covered by a mask layer. A precise control of a gas adsorption amount may realize a quantitative control of the DMI intensity at the interface between the free layer and the spin orbit coupling layer within the adsorption window. After performing a plurality of times of photolithography processes and gas adsorption processes, the DMI of each region of the free layer may be adjusted to a desired value. The region having a large DMI is equivalent to a potential well for the magnetic domain wall, and when the potential well has an appropriate depth, the potential well may effectively pin the magnetic domain wall. For the free layer in a non-pinning region, enhancing the intensity of DMI may also increase the motion velocity of the magnetic domain wall, thereby achieving the reduction the required pulsed current amplitude. In addition, a DMI enhancement layer (Ti, W, Co) may be interposed between the free layer and the barrier layer to further improve the DMI intensity of the free layer.

Third, the adsorption of gas (such as $H_2$) at the surface/interface of a heavy metal spin orbit coupling layer may greatly enhance the effective mixed spin conductance and spin transparency of the spin orbit coupling layer, so that an efficiency of electron charge flow to spin flow conversion, i.e., an efficiency of the SOT driven magnetic domain wall motion, may be further improved, thereby further improving the operation speed of the device and reducing energy consumption.

Finally, the magnetic domain may be driven to a different position by accumulating a pulse number, so as to achieve switching of different resistance states of the MTJ. Therefore, there are no strict requirements on the pulse waveform and amplitude ($>J_c$, where $J_c$ is a threshold current for the depinning of the magnetic domain wall) in the present disclosure, which may avoid a precise modulation on the pulse.

In addition, the above definitions on devices and methods are not limited to the various specific structures, shapes or methods mentioned in the embodiments, and those of ordinary skill in the art may simply modify or replace them, for example:

(1) Dimensions of the device and each layer thereof may be reduced according to the process, and the shape may be simply replaced with other shapes;

(2) The up and down sequence of the positions of various layer may be changed;

(3) The interval between the pinning regions may be changed to achieve different function functionalities.

Figure 2:
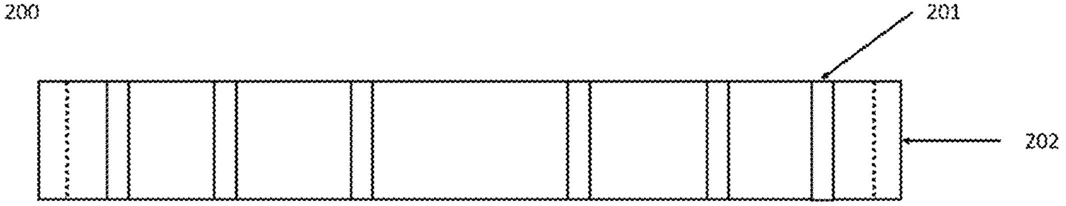
FIG. 2 shows a schematic diagram of a distribution of pinning regions of a free layer according to an embodiment of the present disclosure.

FIG. 2 shows a schematic diagram of an arrangement of a free layer pinning region 200 in this technical solution. A region represented by 201 is a magnetic domain wall pinning region set artificially, and the DMI intensity of the pinning region is enhanced by performing the adsorption of gas (such as $O_2$). The intervals between adjacent pinning regions are non-uniformly set according to the functionality of the Sigmoid function to be implemented. Referring to FIG. 1 and FIG. 2, in FIG. 1, two ends of the ferromagnetic free layer 106 have magnetic moments respectively pinned in opposite directions (+z/−z) by antiferromagnetic pinning layers 105 and 109 by the antiferromagnetic coupling effect, so as to serve as nucleation regions for a magnetic domain wall. The white regions 202 with dotted lines at the two ends shown in FIG. 2 correspond to the nucleation regions for a magnetic domain wall in FIG. 1. The pinning regions 201 are located in a region of the ferromagnetic free layer 106 between the antiferromagnetic pinning layers 105 and 109 in a horizontal direction. The pinning regions 201 overlap with the nonmagnetic barrier layer 103 and the ferromagnetic reference layer 102 in a vertical direction. Accordingly, orthographic projections of the pinning regions 201 on a plane where the spin orbit coupling layer 107 is located do not overlap orthographic projections of the antiferromagnetic pinning layers 105 and 109 on said plane; and the orthographic projections of the pinning regions 201 on said plane overlap with orthographic projections of the nonmagnetic barrier layer 103 and the ferromagnetic reference layer 102 on said plane, and fall within an orthographic projection of the spin orbit coupling layer 107 on said plane.

Figure 3:
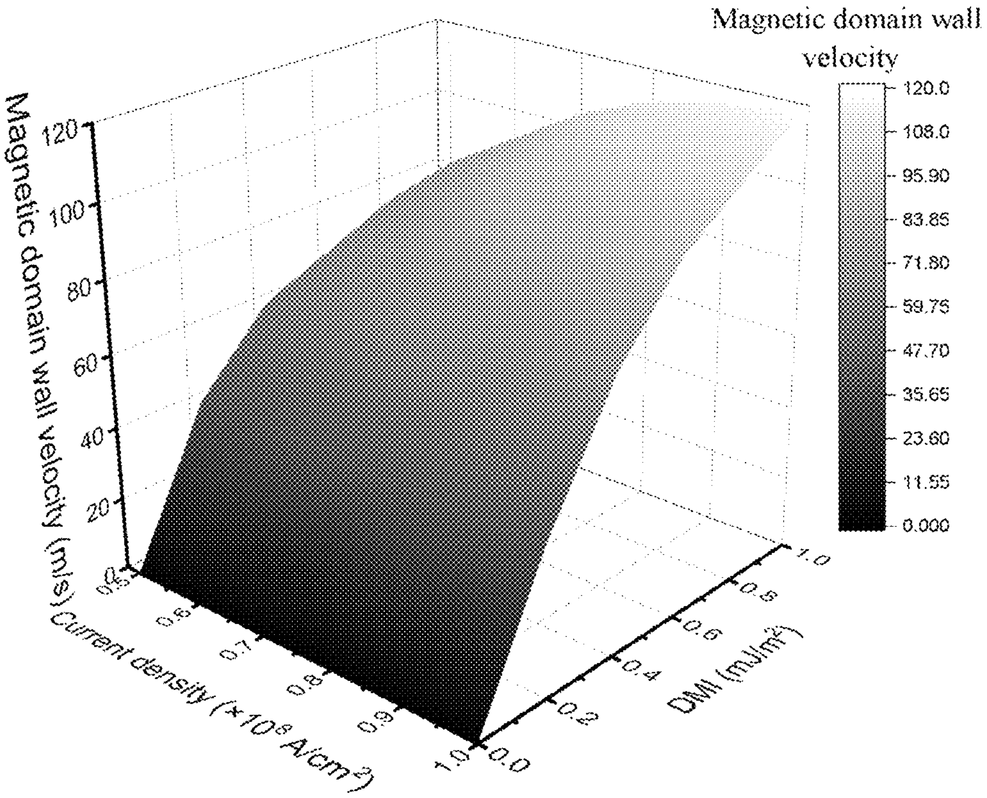
FIG. 3 shows a diagram of a relationship between a velocity at which a magnetic domain wall moves, a pulse amplitude, and a DMI intensity according to an embodiment of the present disclosure.

FIG. 3 shows a relationship between a magnetic domain wall motion velocity, a pulse amplitude and a DMI intensity, as the pulse amplitude and the DMI intensity change. It can be seen from the figure that increasing the pulse current amplitude and enhancing the DMI intensity may both significantly increase the magnetic domain wall motion velocity. The region having a large DMI is equivalent to an energy potential well for the magnetic domain wall. The magnetic domain wall may be effectively pinned through a reasonable design of DMI intensity and a reasonable design of pinning region width. In addition, an overall increasing of the DMI intensity at the interface between the free layer and the spin orbit coupling layer may increase the magnetic domain wall motion velocity under the same pulse current conditions, so that the requirements on the pulse current amplitude and the pulse width may be reduced, thereby reducing the energy consumption of the device.

Figure 4:
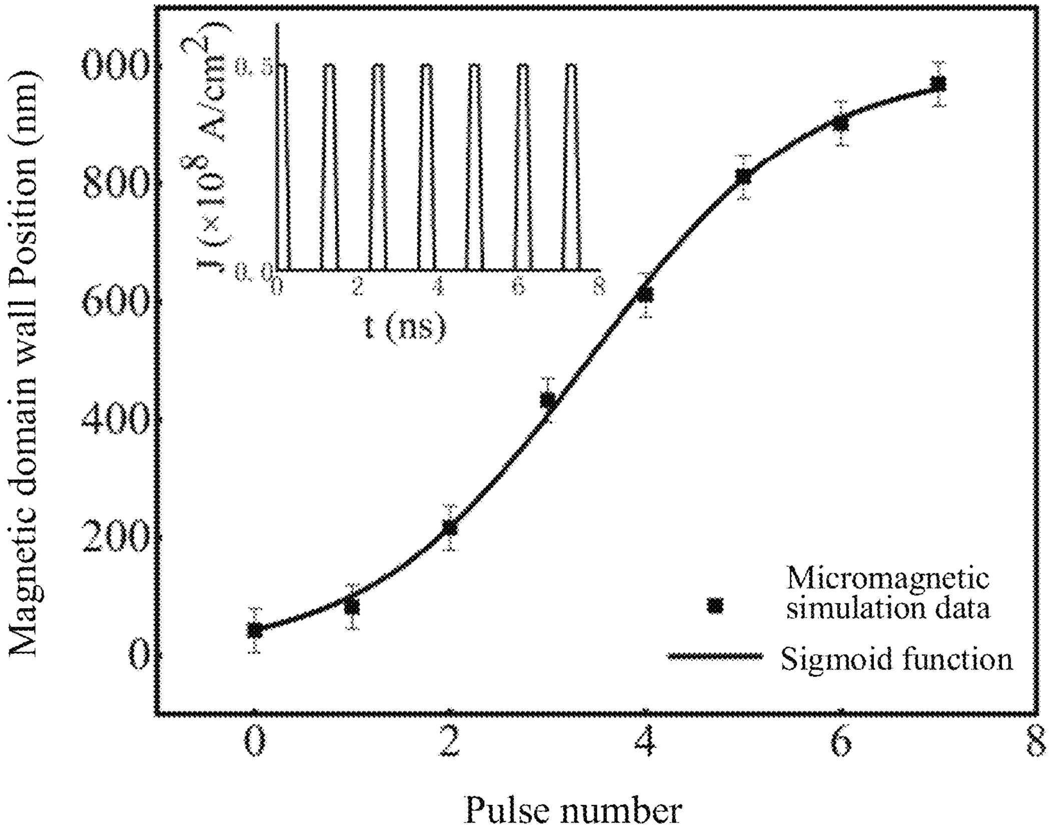
FIG. 4 shows a relationship between a magnetic domain wall position and a pulse number, as the pulse number changes, according to an embodiment of the present disclosure.

FIG. 4 shows a relationship between a magnetic domain wall position of the activation function generator and a pulse number, as the pulse number changes, according to the present disclosure. Each of the discrete point represents a position of the magnetic domain wall after the application of a respective pulse, where the positions of the magnetic domain wall are obtained through a mumax3 simulation, and the curve is a fitting result according to the Slogistic function. The illustration at the upper left corner is a continuous pulse used in this embodiment, which has an amplitude of $5\times10^{11}$ A/cm$^2$ and a pulse width of 200 ps, and the magnetic domain wall has a free relaxation time of 1 ns after the pulse is applied. It may be seen from the fitting result that the activation function generator of the present disclosure may have a good implementation of the functionality of the Sigmoid activation function.

Figure 5:
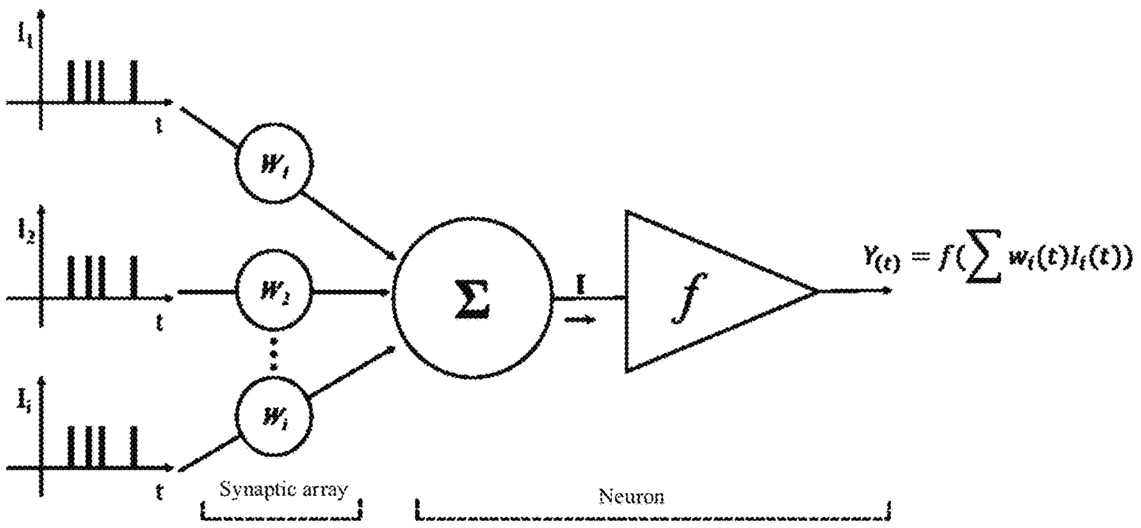
FIG. 5 shows a 3×3 simple neural network for demonstration, which is constructed based on the technical solution in the present disclosure, according to an embodiment of the present disclosure.
Figure 5:
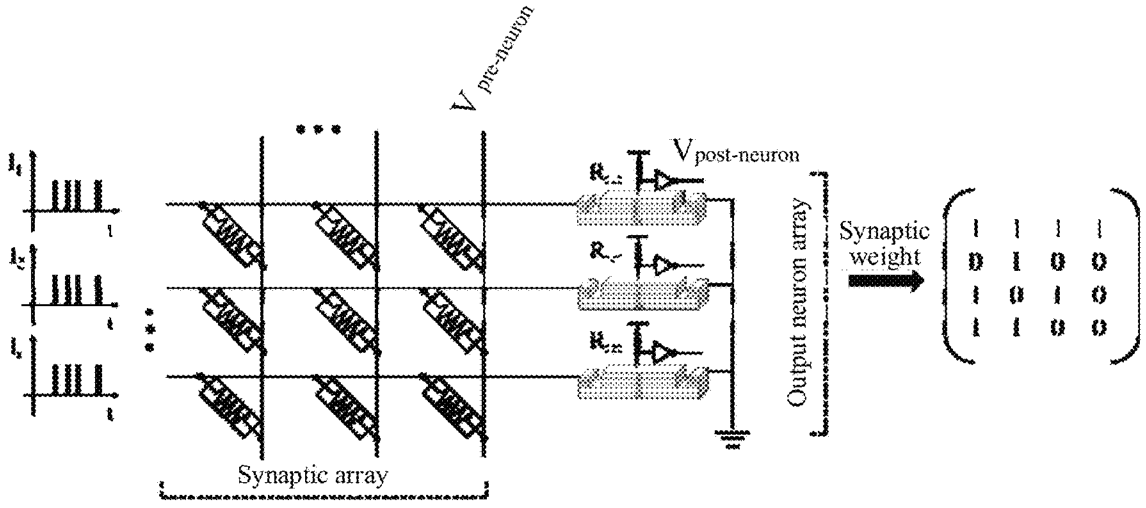

FIG. 5 shows an ANN neural network constructed based on the activation function generator of the present technical solution. FIG. 5(*a*) shows a schematic diagram of a neural network, including a synapse array and a neuron array. An input signal from a pre-neuron is weighted and summed by the synaptic array and then input to the neuron array, and the neuron array generates an output signal according to the activation function to be implemented. FIG. 5(*b*) shows a simple ANN network implemented by the activation function generator according to the present technical solution, where a binary synaptic network is used. A synaptic weight "1" corresponds to a low synaptic resistance, a weight "0" represents a high synaptic resistance, and a weight distribution for demonstration is as shown in the matrix in the figure. In a high resistance state, the current flowing into the activation function generator from the synapse has an amplitude lower than a density of threshold current for the depinning of the magnetic domain wall, and the input is an invalid pulse.

Figure 6:
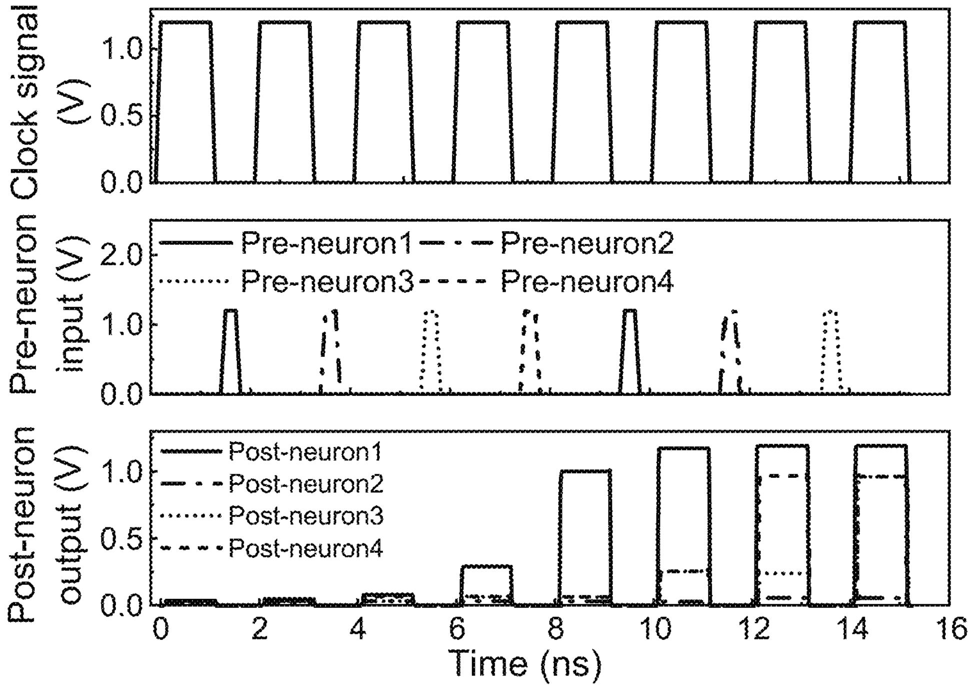
FIG. 6 shows a circuit simulation result of a 4×4 neural network according to an embodiment of the present disclosure.

The circuit simulation results are as shown in FIG. 6. The input signal of the pre-neuron is weighted by the synapse array to change the resistance state of the activation function generator, and the resistance state of the device is read using an inverter under the control of a clock signal, so as to obtain a corresponding output voltage. It may be seen from FIG. 6 that according to the present technical solution, the functionality of the nonlinear activation function is implemented. It should be noted that according to the technical solution of the present disclosure, the function of the synaptic device may be achieved by setting the pinning regions at equal intervals, which is beneficial to the construction of the neural network and the reduction of the difficulty of integration.

In summary, compared with the prior art, the activation function generator based on a magnetic domain wall driven magnetic tunnel junction of the present disclosure has at least one of the following beneficial effects:

(1) The activation function generator may precisely control the magnetic domain wall by modulating the number of pulse currents, so as to achieve the functionality of the neuron Sigmoid activation function without a complex modulation on the pulse current, while owning a low power consumption, a high device velocity, a high reliability and a high circuit compatibility.

(2) The activation function generator may efficiently adjust the DMI intensity at the interface between the free layer and the spin orbit coupling layer and the SOT driven magnetic domain wall motion efficiency by performing the adsorption of gas (such as $O_2$ or $H_2$) at the surfaces of or the interface between the free layer and the heavy metal spin orbit coupling layer, thereby avoiding processing of a non-uniform shape of a corresponding material and improving the stability of the device.

(3) With the same technical solution, it is possible to achieve the function of a synaptic device by simply replacing a combination of non-uniformly distributed pinning regions with a combination of uniformly distributed pinning regions, which is conducive to the construction of a neural network and the reduction of the difficulty of integration.

In the specific embodiments described above, the objectives, technical solutions and beneficial effects of the present disclosure are further described in detail. It should be understood that the above descriptions are merely specific embodiments of the present disclosure, which are not intended to limit the present disclosure. Any modifications, equivalent replacements, improvements, etc. within the spirits and principles of the present disclosure shall fall within the protection scope of the present disclosure.

What is claimed is:

1. An activation function generator based on a magnetic domain wall driven magnetic tunnel junction, comprising:

a spin orbit coupling layer configured to generate a spin orbit torque;

a ferromagnetic free layer formed on the spin orbit coupling layer and configured to provide a magnetic domain wall motion racetrack;

a nonmagnetic barrier layer formed on the ferromagnetic free layer;

a ferromagnetic reference layer formed on the nonmagnetic barrier layer;

a top electrode formed on the ferromagnetic reference layer;

antiferromagnetic pinning layers formed on two ends of the ferromagnetic free layer; and a left electrode and a right electrode respectively formed at two positions on the antiferromagnetic pinning layers, wherein the ferromagnetic free layer has a plurality of pinning regions arranged at intervals, orthographic projections of the plurality of pinning regions on a plane where the spin orbit coupling layer is located do not overlap orthographic projections of the antiferromagnetic pinning layers on the plane where the spin orbit coupling layer is located; and the orthographic projections of the plurality of pinning regions on the plane where the spin orbit coupling layer is located overlap with orthographic projections of the nonmagnetic barrier layer and the ferromagnetic reference layer on the plane where the spin orbit coupling layer is located; and wherein the orthographic projections of the plurality of pinning regions on the plane where the spin orbit coupling layer is located fall within the spin orbit coupling layer.

2. The activation function generator according to claim 1, wherein a material of the spin orbit coupling layer comprises one or more of W, Pt, Pd or Ta, or an alloy based on one or more of W, Pt, Pd or Ta; the ferromagnetic free layer and the ferromagnetic reference layer comprise one or more of a CoFeB, CoFe, Co/Pt or Ni/Co material with perpendicular magnetic anisotropy; a synthetic antiferromagnetic layer or a ferrimagnetic layer is selected to be formed by the ferromagnetic reference layer so as to eliminate an effect of a stray field of the reference layer on magnetic domain wall motion; and the nonmagnetic barrier layer comprises one or more of MgO, $HfO_x$ or $AlO_x$.

3. The activation function generator according to claim 1, wherein the two ends of the ferromagnetic free layer have magnetic moment directions respectively pinned in a +z direction and a −z direction through antiferromagnetic coupling, so as to serve as nucleation regions for a magnetic domain wall; under control of a pulse current, a magnetic domain wall nucleates in a local pinning region at the two ends of the ferromagnetic free layer and moves in the free layer; and a magnetoresistance change of a magnetic tunnel junction device is linearly related to a moving distance of the magnetic domain wall in the free layer.

4. The activation function generator according to claim 1, wherein in a manufacturing process, a Dzyaloshinskii-Moriya interaction (DMI) intensity at an interface between the free layer and the spin orbit coupling layer in a corresponding region is quantitatively adjusted by performing chemical adsorption of gas at an interface of the free layer.

5. The activation function generator according to claim 1, wherein the activation function generator implements different functionalities of the activation function by changing an interval between the pinning regions.

6. The activation function generator according to claim 1, wherein an effective mixed spin conductance and a spin transparency of the spin orbit coupling layer are enhanced by performing gas adsorption at a surface or an interface of a heavy metal spin orbit coupling layer.

7. The activation function generator according to claim 1, wherein a combination of non-uniformly distributed pinning regions is replaced with a combination of uniformly distributed pinning regions, so as to achieve a function of a synaptic device.

8. A method for manufacturing the activation function generator according to claim 1, comprising:

forming local pinning regions at the two ends of the ferromagnetic free layer through antiferromagnetic coupling, wherein the two local pinning regions have magnetic moment directions respectively pinned in a +z direction and a −z direction, so as to serve as nucleation regions for a magnetic domain wall; applying a pulse current to form a magnetic domain wall in the local pinning region, wherein the magnetic domain wall moves in the free layer under control of a spin orbit moment generated by the pulse current;

designing a domain wall pinning region;

performing gas adsorption at a surface or an interface of a heavy metal spin orbit coupling layer, so as to greatly enhance an effective mixed spin conductance and a spin transparency of the spin orbit coupling layer; and driving a magnetic domain to different positions by accumulating a pulse number, so as to switch between different resistance states of the magnetic tunnel junction.

9. The manufacturing method according to claim 8, wherein a polarity of the pulse current is changed so as to control nucleation of magnetic domain wall and drive the magnetic domain wall to move.

10. The manufacturing method according to claim 8, wherein a magnetoresistance of the magnetic domain wall driven magnetic tunnel junction is represented by:

$$R_{MTJ} = R_P \frac{x_0}{L} + R_{AP}\left(1 - \frac{x_0}{L}\right)$$

wherein $x_0$ is a final moving distance of the magnetic domain wall, L is a total length of the magnetic tunnel junction, $R_P$ is a magnetoresistance corresponding to magnetization directions of the ferromagnetic free layer and the reference layer being parallel, which is a minimum magnetoresistance; $R_{AP}$ is a magnetoresistance corresponding to the magnetization directions of the ferromagnetic free layer and the reference layer being antiparallel, which is a maximum magnetoresistance; and a DMI enhancement layer is interposed between the ferromagnetic free layer and the nonmagnetic barrier layer.

* * * * *